(12) United States Patent
Tzoufras et al.

(10) Patent No.: US 10,424,357 B2
(45) Date of Patent: Sep. 24, 2019

(54) MAGNETIC TUNNEL JUNCTION (MTJ) MEMORY DEVICE HAVING A COMPOSITE FREE MAGNETIC LAYER

(71) Applicant: SPIN MEMORY, INC., Wilmington, DE (US)

(72) Inventors: Michail Tzoufras, Sunnyvale, CA (US); Elizabeth Ann Dobisz, San Jose, CA (US); Marcin Gajek, Berkeley, CA (US); Davide Guarisco, San Jose, CA (US); Bartlomiej Adam Kardasz, Pleasanton, CA (US)

(73) Assignee: SPIN MEMORY, INC., Wilmington, DE (US)

( * ) Notice: Subject to any disclaimer, the term of this patent is extended or adjusted under 35 U.S.C. 154(b) by 0 days.

(21) Appl. No.: 15/859,157

(22) Filed: Dec. 29, 2017

(65) Prior Publication Data

US 2019/0206464 A1 Jul. 4, 2019

(51) Int. Cl.
*G11C 11/16* (2006.01)
*H01L 43/02* (2006.01)
(Continued)

(52) U.S. Cl.
CPC ........ *G11C 11/161* (2013.01); *G11C 11/1673* (2013.01); *H01F 10/329* (2013.01);
(Continued)

(58) Field of Classification Search
CPC ......... H01L 43/02; H01L 43/08; H01L 43/10; H01L 43/12; H01L 27/222;
(Continued)

(56) References Cited

U.S. PATENT DOCUMENTS 4,910,709 A 3/1990 Dhong et al.
5,656,842 A 8/1997 Iwamatsu et al.
(Continued)

OTHER PUBLICATIONS

Bhatti et al., "Spintronics based random access memory: a review," Materials Today, vol. 20, No. 9, 530-548, Nov. 2017, from http://dx.doi.org/10.1016/j.mattod.2017.07.007, 19 pgs.
(Continued)

*Primary Examiner* — Marc Anthony Armand
*Assistant Examiner* — Younes Boulghassoul
(74) *Attorney, Agent, or Firm* — Morgan, Lewis & Bockius LLP

(57) ABSTRACT

The various embodiments described herein include methods, devices, and systems for fabricating and performing operations on magnetic memory devices. In one aspect, a magnetic memory device includes: (1) a reference magnetic layer configured to have a first current threshold corresponding to a spin current level required to change a magnetic polarization of the reference magnetic layer; (2) a composite magnetic layer comprising a plurality of non-magnetic layers and a plurality of magnetic layers including a storage layer; and (3) a non-magnetic spacer layer between the reference magnetic layer and the composite magnetic layer; where the composite magnetic layer is configured such that the second current threshold is lowered, without decreasing thermal stability of the magnetic memory device, by spin current and/or coupling fields between adjacent magnetic layers of the plurality of magnetic layers.

7 Claims, 13 Drawing Sheets

(51) Int. Cl.
*H01F 10/32* (2006.01)
*H01L 27/22* (2006.01)
*H01L 43/08* (2006.01)

(52) U.S. Cl.
CPC ..... *H01F 10/3254* (2013.01); *H01F 10/3286* (2013.01); *H01L 27/228* (2013.01); *H01L 43/02* (2013.01); *H01L 43/08* (2013.01)

(58) Field of Classification Search
CPC ... G11C 11/14–161; H01F 10/32–3295; H01F 41/302; H01F 41/303; H01F 41/305; H01F 41/307
See application file for complete search history.

(56) References Cited

U.S. PATENT DOCUMENTS

| | | | |
|---|---|---|---|
| 5,717,373 A | 2/1998 | Vachris | |
| 6,909,631 B2 | 6/2005 | Durlam et al. | |
| 7,166,881 B2 | 1/2007 | Lin et al. | |
| 7,224,601 B2 | 5/2007 | Panchula | |
| 7,248,498 B2 | 7/2007 | Nazarian | |
| 7,577,019 B2 | 8/2009 | Hung et al. | |
| 7,800,938 B2 | 9/2010 | Rivkin et al. | |
| 7,826,260 B2 | 11/2010 | Zhu et al. | |
| 7,872,905 B2 | 1/2011 | Florez Marino et al. | |
| 7,936,597 B2 | 5/2011 | Clinton et al. | |
| 8,008,706 B2 | 8/2011 | Choi et al. | |
| 8,077,509 B2 | 12/2011 | Yanagi et al. | |
| 8,107,280 B2 | 1/2012 | Yoon et al. | |
| 8,179,711 B2 | 5/2012 | Kim et al. | |
| 8,194,361 B2 | 6/2012 | Kudo et al. | |
| 8,199,553 B2 | 6/2012 | Chen et al. | |
| 8,203,389 B1 | 6/2012 | Zhou et al. | |
| 8,345,474 B2* | 1/2013 | Oh | G11C 11/161 |
| | | | 365/148 |
| 8,353,568 B2 | 1/2013 | Lee | |
| 8,416,539 B2 | 4/2013 | Carey et al. | |
| 8,421,440 B2 | 4/2013 | Oksanen et al. | |
| 8,508,973 B2 | 8/2013 | Jin et al. | |
| 8,587,993 B2 | 11/2013 | Lee et al. | |
| 8,625,337 B2 | 1/2014 | Wu et al. | |
| 8,633,720 B2 | 1/2014 | Tudosa et al. | |
| 8,724,380 B1 | 5/2014 | Zhou et al. | |
| 8,817,546 B2 | 8/2014 | Wang | |
| 9,110,746 B2 | 8/2015 | Zhu et al. | |
| 9,142,277 B2 | 9/2015 | Kim et al. | |
| 9,166,147 B2 | 10/2015 | Carman et al. | |
| 9,208,878 B2 | 12/2015 | Iyer et al. | |
| 9,230,571 B1 | 1/2016 | Chen et al. | |
| 9,236,416 B2 | 1/2016 | Shukh | |
| 9,240,799 B1 | 1/2016 | Wang et al. | |
| 9,337,415 B1 | 5/2016 | Oh et al. | |
| 9,362,336 B2 | 6/2016 | Lu | |
| 9,443,905 B1 | 9/2016 | Bandic et al. | |
| 9,460,769 B2 | 10/2016 | Nozaki et al. | |
| 9,461,094 B2 | 10/2016 | Li et al. | |
| 9,502,133 B2 | 11/2016 | Ueda et al. | |
| 9,503,097 B2 | 11/2016 | Lee et al. | |
| 9,525,126 B1 | 12/2016 | Lin | |
| 9,543,505 B2 | 1/2017 | Park et al. | |
| 9,595,917 B2 | 3/2017 | Kan et al. | |
| 9,608,043 B2 | 3/2017 | Shimabukuro et al. | |
| 9,634,237 B2 | 4/2017 | Lee et al. | |
| 9,637,272 B2 | 5/2017 | Albaum | |
| 9,660,183 B2 | 5/2017 | Wang et al. | |
| 9,678,178 B2 | 6/2017 | Bai et al. | |
| 9,734,882 B2 | 8/2017 | Toh et al. | |
| 9,741,926 B1* | 8/2017 | Pinarbasi | H01L 43/08 |
| 9,766,705 B2 | 9/2017 | Chan et al. | |
| 9,773,913 B1 | 9/2017 | Balakrishnan et al. | |
| 9,799,383 B2 | 10/2017 | Hosotani et al. | |
| 10,109,367 B2 | 10/2018 | Raberg | |
| 2003/0183889 A1 | 10/2003 | Kajiyama | |
| 2004/0047204 A1 | 3/2004 | Hung et al. | |
| 2005/0073878 A1 | 4/2005 | Lin et al. | |
| 2005/0184348 A1 | 8/2005 | Youn et al. | |
| 2005/0232006 A1 | 10/2005 | Iwata | |
| 2006/0152969 A1 | 7/2006 | Trouilloud | |
| 2007/0201265 A1 | 8/2007 | Ranjan et al. | |
| 2007/0210338 A1 | 9/2007 | Orlowski | |
| 2009/0032849 A1 | 2/2009 | Higashino | |
| 2010/0052029 A1 | 3/2010 | Huang | |
| 2010/0102290 A1 | 4/2010 | Lu et al. | |
| 2010/0187601 A1 | 7/2010 | Masuoka et al. | |
| 2011/0062515 A1 | 3/2011 | Masuoka et al. | |
| 2011/0141803 A1* | 6/2011 | Kim | B82Y 25/00 |
| | | | 365/171 |
| 2012/0155164 A1 | 6/2012 | Shukh | |
| 2012/0217468 A1 | 8/2012 | Tekleab et al. | |
| 2012/0313742 A1 | 12/2012 | Kurs et al. | |
| 2012/0320666 A1* | 12/2012 | Ohno | H01L 43/08 |
| | | | 365/158 |
| 2013/0200467 A1 | 8/2013 | Edge et al. | |
| 2013/0258763 A1 | 10/2013 | Ranjan et al. | |
| 2014/0008606 A1 | 1/2014 | Hussain et al. | |
| 2014/0050019 A1 | 2/2014 | Lee et al. | |
| 2014/0103470 A1 | 4/2014 | Shukh | |
| 2014/0151830 A1* | 6/2014 | Apalkov | H01L 43/08 |
| | | | 257/427 |
| 2014/0151831 A1* | 6/2014 | Chen | H01L 43/08 |
| | | | 257/427 |
| 2014/0170821 A1 | 6/2014 | Nyhus et al. | |
| 2014/0264513 A1 | 9/2014 | De Brosse et al. | |
| 2014/0264552 A1 | 9/2014 | Prabhakar et al. | |
| 2015/0021675 A1 | 1/2015 | Min | |
| 2015/0138873 A1 | 5/2015 | Lu et al. | |
| 2015/0279904 A1 | 10/2015 | Pinarbasi et al. | |
| 2016/0079361 A1 | 3/2016 | Ching et al. | |
| 2016/0225818 A1 | 8/2016 | Toh et al. | |
| 2016/0240542 A1 | 8/2016 | Kwon | |
| 2016/0315249 A1* | 10/2016 | Kardasz | G11C 11/161 |
| 2016/0372656 A1 | 12/2016 | Pinarbasi et al. | |
| 2017/0005106 A1 | 1/2017 | Zhang | |
| 2017/0084826 A1* | 3/2017 | Zhou | H01F 10/3286 |
| 2017/0110651 A1* | 4/2017 | Park | H01L 43/02 |
| 2017/0178705 A1 | 6/2017 | Buhrman et al. | |
| 2017/0317070 A1 | 11/2017 | Satcedo et al. | |
| 2018/0075895 A1 | 3/2018 | Kishi et al. | |
| 2018/0096896 A1 | 4/2018 | Zhu | |
| 2018/0269210 A1 | 9/2018 | Tezuka et al. | |
| 2018/0308534 A1 | 10/2018 | Gaudin et al. | |

OTHER PUBLICATIONS

Chen et al., "On-Chip Caches Built on Multilevel Spin-Transfer Torque RAM Cells and Its Optimizations," ACMJournal on Emerging Technologies in Computing Systems, vol. 9, No. 2, Article 16, May 2013, 22 pgs.
Chen et al., "Processor Caches Built Using Multi-Level Spin-Transfer Torque RAM Cells," Jun. 2011 © 2011 IEEE, 6 pgs.
Dyakonov, M. I., "Spin Hall Effect," arXiv:1210.3200v1 (2010), from https://arxiv.org/ftp/arxiv/papers/1210/1210.3200.pdf, 12 pgs.
Eitan et al., "NROM: A Novel Localized Trapping, 2-Bit Nonvolatile Memory Cell," IEEE Electron Device Letters, vol. 21, No. 11, Nov. 2000, 3 pgs.
Jiang et al., "Constructing Large and Fast Multi-Level Cell STT-RAM based Cache for Embedded Processors," DAC 20125, Jun. 3-7, 2012, San Francisco, California, 6 pgs.
Li Gao, "Spin Polarized Current Phenomena in Magnetic Tunnel Junctions," Ph.D. Dissertation, Stanford University, Sep. 2009, 126 pgs.
Li et al., A New Self-reference Sensing Scheme for TLC MRAM, Sep. 2015 © 2015 IEEE, 4 pgs.
Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.
Van den Brink et al., "Spin-Hall-assisted magnetic random access memory," Applied Physics Letters, 104, 012403 (2014), 4 pgs.

(56) References Cited

OTHER PUBLICATIONS

Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.
Wang et al., "Spintronic materials and devices based on antiferromagnetic metals," Progress in Natural Science: Materials International, Oct. 23, 2016, 27 (2017) 208-216, 9 pgs.
Yuen et al., "A 2-Bit MONOS Nonvolatile Memory Cell Based on Asymmetric Double Gate MOSFET Structure," IEEE Electron Device Letters, vol. 24, No. 8, Aug. 2003, 3 pgs.
Zhang et al., "MLC STT-RAM Design Considering Probabilistic and Asymmetric MTJ Switching," Mar. 2013 © 2013 IEEE, 4 pgs.
Zhang et al., Multi-level Cell STT-RAM: Is it Realistic or Just a Dream?, IEEE/ACM International Conference on Computer-Aided Design, Nov. 5-8, 2012, San Jose, California, 8 pgs.
Bozdag, Office Action dated Jul. 18, 2018, U.S. Appl. No. 15/859,259, 15 pgs.
Kim, Office Action dated Sep. 17, 2018, U.S. Appl. No. 15/865,125, 10 pgs.
Sharma, Notice of Allowance dated Sep. 13, 2018, U.S. Appl. No. 15/865,138, 17 pgs.
Beleggia et al., "Phase Diagram for Magnetic Nano-Rings, May 27, 2005, Journal of Magnetism and Magnetic Materials," 16 pgs.
Fernandez-Pacheco et al., "Three-dimensional nanomagnetism," Nat. Comm. 8, 15756 (2017).
Laczkowski et al., "Large enhancement of the spin Hall effect in Au by side-jump scattering on Ta impurities," Phys. Rev. B 96, 140405(R) (2017).
Lavrijsen et al., "Magnetic ratchet for three-dimensional spintronic memory and logic," Nature 493, pp. 647-650 (2013).
Lavrijsen et al., "Multi-bit operations in vertical spintronic shift registers," Nanotechnology 25, 105201 (2014).
Lavrijsen et al., "Tuning the interlayer exchange coupling between single perpendicularly magnetized CoFeB layers," Appl. Phys. Lett. 100, 052411 (2012).
Lee et al., "Domain Imaging During Soliton Propagation in a 3D Magentic Ratchet," Spin 3(4), 1340013 (2013).
Lee et al., "Soliton propagation in micron-sized magnetic ratchet elements," Appl. Phys. Lett. 104, 232404 (2014).
Mansell et al., "A magnetic shift register with out-of-plane magnetized layers," Nanotechnology 28, 385201 (2017).
Mansell et al., "A robust soliton ratchet using combined antiferromagnetic and ferromagnetic interlayer couplings," Appl. Phys. Lett. 106, 092404 (2015).
Parkin, "Systematic Variation of the Strength and Oscillation Period of Indirect Magnetic Exchange Coupling through the 3d, 4d, and 5d Transition Metals," Phys. Rev. Lett. 67(25), pp. 3598-3601 (1991).
Petit et al., "Systematic layer-by-layer characterization of multilayers for three-dimensional data storage and logic," Nanotechnology 27, 155203 (2016).
Tzoufras, Office Action dated Nov. 9, 2018, U.S. Appl. No. 15/858,808, 8 pgs.
Bozdag, Final Office Action dated Dec. 3, 2018, U.S. Appl. 15/859,259, 14 pgs.
Bozdag, Notice of allowance dated Feb. 13, 2019, U.S. Appl. No. 15/859,259, 9 pgs.
Bozdag, Office Action, U.S. Appl. 15/859,256, dated Jan. 22, 2019, 12 pgs.
Bozdag, Notice of Allowance, U.S. Appl. No. 15/859,256, dated Apr. 24, 2019, 9 pgs.
Bozdag, Office Action, U.S. Appl. No. 15/859,250, dated Feb. 1, 2019, 12 pgs.
Bozdag, Notice of Allowance, U.S. Appl. No. 15/859,250, dated Apr. 25, 2019, 9 pgs.
Kim, Notice of Allowance dated Jan. 25, 2019, U.S. Appl. No. 15/865,125, 5 pgs.
Kim, Office Action dated Nov. 28, 2018, U.S. Appl. No. 15/865,144, 9 pgs.
Sharma, Notice of Allowance dated Sep. 25, 2018, U.S. Appl. No. 15/865,140, 10pgs.
Sharma, Notice of Allowance dated Sep. 26, 2018, U.S. Appl. No. 15/865,132, 11 pgs.
Sharma, Notice of Allowance dated Sep. 24, 2018, U.S. Appl. No. 15/865,123, 11 pgs.

* cited by examiner (Parallel Configuration)

(Anti-Parallel Configuration)

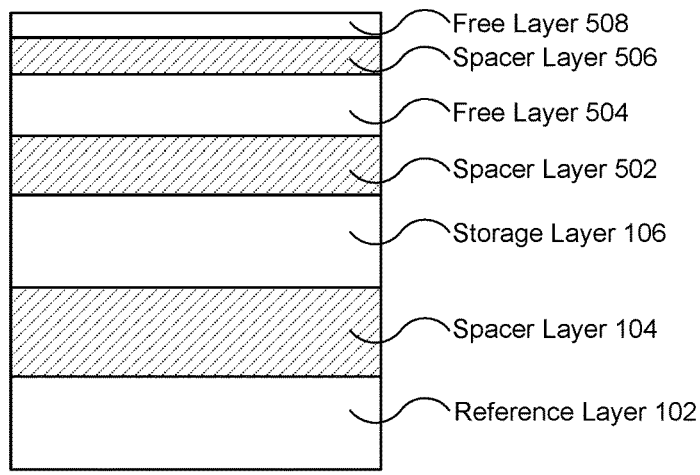
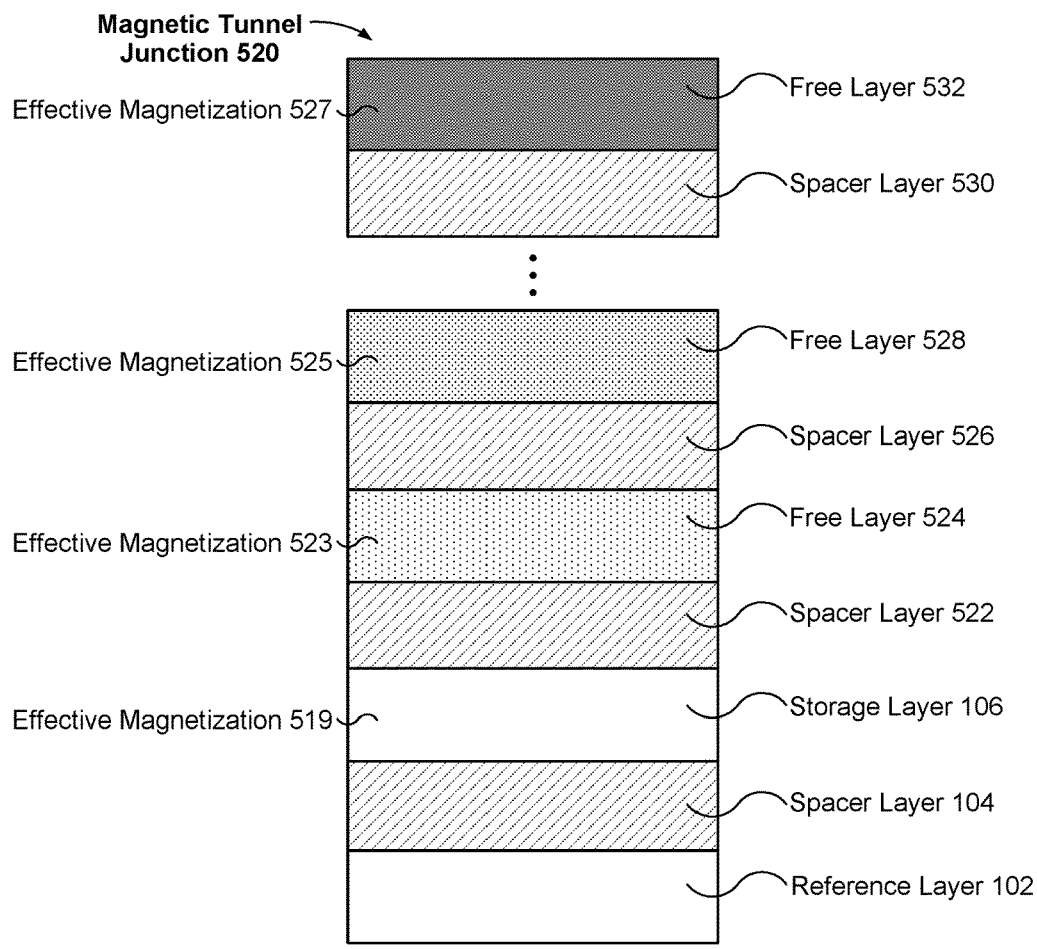
Figure 5A
Figure 5B (Parallel Configuration)

(Anti-Parallel Configuration)

(Parallel Configuration)

MAGNETIC TUNNEL JUNCTION (MTJ) MEMORY DEVICE HAVING A COMPOSITE FREE MAGNETIC LAYER

TECHNICAL FIELD

This relates generally to the field of memory applications, including but not limited to magnetic memory.

BACKGROUND

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The field of memory applications is becoming more challenging as the performance requirements for memory-based devices increase. Because of many useful properties of MRAM (e.g., retention of data, resistance to errors, and life span of memory cells), memory systems based on MRAM have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes various implementations of MRAM systems and devices. As discussed in greater detail below, MRAM stores data through magnetic storage elements. These elements typically include two ferromagnetic films or layers that can hold a magnetic field and are separated by a non-magnetic material. In general, one of the layers has its magnetization pinned (e.g., a "reference layer"), meaning that this layer requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be sub-micron in lateral size and the magnetization direction can still be stable over time and with respect to thermal fluctuations.

In particular, the present disclosure describes magnetic memory devices that reduce the voltage required for switching without sacrificing thermal stability. In particular, in accordance with some implementations, the memory devices utilize multiple free layers that are successively easier to switch in order to facilitate switching of the storage layer without lowering a thermal stability of the storage layer. The advantages of such memory devices are that they are more thermally stable and operate with a lower switching voltage than conventional magnetic memory devices.

In conventional perpendicular magnetic tunnel junction (pMTJ) devices, increasing the thermal stability comes at the cost of making the device harder to switch. Conversely, making the device easier to switch comes at the cost of reduced thermal stability. However, unlike thermal switching, which is determined by the static properties of the device, current switching is a dynamic process that involves spin currents going through the device.

In some implementations, a composite free layer is provided that is statically more stable than a conventional pMTJ. In some implementations, when a current is applied, the composite free layer starts unraveling (switching) from its weakest link, such that whenever a component switches it becomes easier for the remaining components to switch (e.g., a cascade is present). This yields an overall reduction of the switching voltage even though the thermal stability of the device is higher.

In some implementations, a ferromagnetic layer (FM) is added to a conventional pMTJ. This layer is separated from the storage layer (SM) by a spacer layer ($S_2$), e.g. composed of MgO. In some implementations, the magnetization of FM is weakly out-of-plane, aligned with the storage layer, such that it enhances the overall thermal stability of the device. In some implementations, when a voltage is applied to this device while it is in the parallel (P) configuration, FM switches first due to spin current from the storage layer and it forms a pseudo-dual junction for the storage layer, thereby reducing the overall voltage threshold required to switch the storage layer. In some implementations, coupling fields between the FM and the storage layer are configured to further facilitate switching of the storage layer once the FM has switched. In the AP configuration the device is already in a pseudo-dual junction configuration for the storage layer and therefore it also has lower voltage threshold.

In some implementations, a composite magnetic layer composed of several ferromagnetic layers ($FM_i$) separated from one another with suitable spacers ($S_i$) is provided. The effective magnetization of each ferromagnetic layer is given by Equation 1:

$$M_{eff,i} = N_{zz}M_{s,i} - \frac{2K_i}{(\mu_0 M_{s,i})} \qquad \text{Equation 1}$$

Effective Magnetization

In Equation 1, 'i' is the particular ferromagnetic layer, $N_{zz}$ is the demagnetizing factor, $M_{s,i}$ is the saturation magnetization of the 'i' layer, $K_i$ is the anisotropy energy density (including both the bulk magnetocrystalline anisotropy and surface anisotropy contributions), and $\mu_0$ is a constant corresponding to the permeability of a vacuum (e.g., $4\pi \times 10^{-7}$ N/m).

The effective magnetization of the 'i' layer is defined by Equation 1. For perpendicular MTJs, the magnetization vector at either of the stable points (AP configuration or P configuration) is out-of-plane and this is indicated by $M_{eff}$ of the corresponding layer being negative. Because $M_{eff}$ is a scalar rather than a vector, it does not indicate a direction of magnetization. Nevertheless, very negative $M_{eff}$ values result in equilibrium configurations with the magnetization strongly out-of-plane (e.g., that are hard to switch). Thus, in accordance with some implementations, the most negative $M_{eff}$ (other than the reference layer) is the $M_{eff}$ of the storage layer. The free layers above the storage layer have successively higher values for $M_{eff}$ (meaning less negative), and can even be positive, meaning in-plane in equilibrium in accordance with some implementations. Thus, in accordance with some implementations, for the free layers above the storage layer, even though the $M_{eff}$ values are higher (less negative) the magnitude is smaller, except if they switch sign in which case the magnitude starts growing again.

In some implementations, the effective magnetization of each ferromagnetic layer after the storage layer is optionally negative (out-of-plane) or positive (in plane), so as long as $M_{i-1} < M_i$ for each layer 'i'. In some implementations, the corresponding thicknesses and material properties of each layer are varied to achieve a desired effective magnetization for each. In accordance with some implementations, when voltage is applied, each $FM_i$ layer sees a pseudo-dual junction except the weakest layer which is the easiest to switch.

In one aspect, some implementations include a magnetic memory device that includes: (1) a reference magnetic layer configured to have a first current threshold, the first current threshold corresponding to a spin current level required to change a magnetic polarization of the reference magnetic layer; (2) a composite magnetic layer comprising a plurality of non-magnetic layers and a plurality of magnetic layers including a storage layer; and (3) a non-magnetic spacer layer between the reference magnetic layer and the composite magnetic layer; where: (a) the storage layer is configured to have a second current threshold, lower than the first current threshold, the second current threshold corresponding to a spin current level required to change a magnetic polarization of the storage layer; (b) respective magnetic layers of the plurality of magnetic layers are separated by respective non-magnetic layers of the plurality of non-magnetic layers; and (c) the composite magnetic layer is configured such that the second current threshold is lowered, without decreasing thermal stability of the magnetic memory device, by spin current and/or coupling fields between adjacent magnetic layers of the plurality of magnetic layers.

In some implementations, the plurality of magnetic layers also increases a thermal stability of the device. In some implementations, a method of fabricating a magnetic memory device includes: (1) providing a reference magnetic layer having a first current threshold corresponding to a spin current level required to change a magnetic polarization of the reference magnetic layer; (2) providing a first non-magnetic barrier layer positioned on top of the reference magnetic layer; (3) providing a magnetic storage layer positioned on top of the non-magnetic barrier layer, the magnetic storage layer having a second current threshold, less than the first current threshold, corresponding to a spin current level required to change a magnetic polarization of the magnetic storage layer; (4) providing a second non-magnetic barrier layer positioned on top of the magnetic storage layer; and (5) providing an additional magnetic layer on top of the second non-magnetic barrier layer, the magnetic layer having a third current threshold, less than the second current threshold, corresponding to a spin current level required to change a magnetic polarization of the additional magnetic layer.

Thus, devices and systems are provided with methods for fabricating and operating magnetic memory, thereby increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 5A-5B illustrate representative magnetic tunnel junction devices in accordance with some implementations.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

As described in greater detail below, replacing a single storage layer in a magnetic memory device with a composite free layer may provide a reduction in switching voltage and an increase in thermal stability. For example, a composite free layer configured such that a cascade effect occurs when a current is applied lowers a voltage requirement for switching the storage layer without lowering a thermal stability of the storage layer. The reduced voltage requirement enables fabrication and use of smaller devices and lower power designs. The non-lowered (or raised) thermal stability enables fabrication and use of memory devices configured to retain a memory state (e.g., "0" or "1") for extended periods of time (e.g., a day, a month, or a year) without requiring a power source.

Figure 1A:
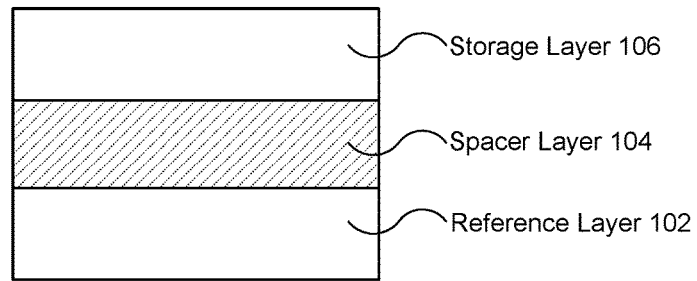
FIG. 1A shows a schematic diagram of a representative magnetic tunnel junction (MTJ) structure in accordance with some implementations.

FIG. 1A is schematic diagram of a magnetic tunnel junction (MTJ) structure 100 (e.g., for use in an MRAM device) in accordance with some implementations. In accordance with some implementations, the MTJ structure 100 is composed of a first ferromagnetic layer (reference layer 102), a second ferromagnetic layer (storage layer 106), and a non-magnetic layer (spacer layer 104). The reference layer 102 is also sometimes referred to as a pinned or fixed layer. The storage layer 106 is also sometimes referred to as a free layer. The spacer layer 104 is also sometimes referred to as a barrier layer. In some implementations, the spacer layer 104 comprises an electrically-conductive material such as a metal. In some implementations, the spacer layer 104 comprises an electrically-insulating material such as silicon oxide.

In some implementations, the reference layer 102 and the storage layer 106 are composed of the same ferromagnetic material. In some implementations, the reference layer 102 and the storage layer 106 are composed of different ferromagnetic materials. In some implementations, the reference layer 102 is composed of a ferromagnetic material that has a higher coercivity than the storage layer 106. In some implementations, the reference layer 102 and the storage layer 106 are composed of different ferromagnetic materials with the same or similar thicknesses (e.g., within 10%, 5%, or 1% of one another). In some implementations, the thickness of the reference layer 102 is different from that of the storage layer 106 (e.g., the reference layer 102 is thicker than the storage layer 106). In some implementations, the thickness of the spacer layer 104 is on the order of a few atomic layers. In some implementations, the thickness of the spacer layer 104 is on the order of a few nanometers.

In some implementations, the reference layer 102 and/or the storage layer 106 is composed of two or more ferromagnetic layers that are separated from one another with spacer layers. In some implementations, each of these ferromagnetic layers is composed of identical, or varying, thickness(es) and/or material(s). In some implementations, the spacer layers are composed of identical, or varying, thickness(es) and/or material(s) with respect to one another.

Figure 1B:
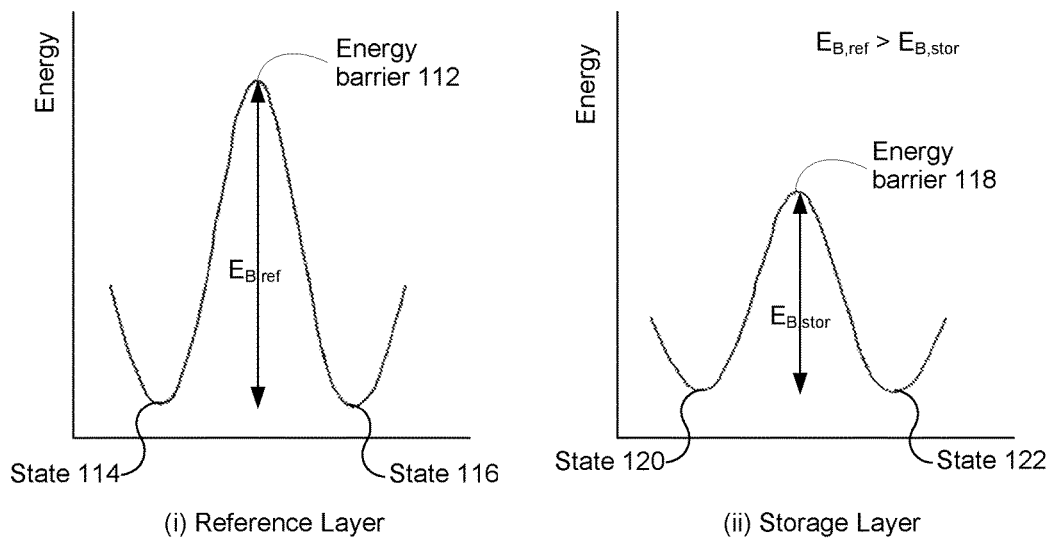
FIG. 1B shows representative energy barriers of the reference and storage layers of the MTJ of FIG. 1A in accordance with some implementations.

Magnetic anisotropy refers to the directional dependence of a material's magnetic properties. The magnetic moment of magnetically anisotropic materials will tend to align with an "easy axis," which is the energetically favorable direction of spontaneous magnetization. In some implementations and instances, the two opposite directions along an easy axis are equivalent, and the direction of magnetization can be along either of them. For example, in accordance with some implementations, FIG. 1B shows low energy states 114 and 116 corresponding to opposite directions along an easy axis.

In some implementations, the MTJ structure 100 is an in-plane MTJ. In this instance, the magnetic moments of the reference layer 102 and the storage layer 106, and correspondingly their magnetization direction, are oriented in the plane of the ferromagnetic films of the reference layer 102 and the storage layer 106.

In some implementations, the MTJ structure 100 is a perpendicular (or out-of-plane) MTJ. In this instance, the magnetic moments of the reference layer 102 and the storage layer 106, and correspondingly their magnetization direction, are oriented perpendicular and out-of-plane to the ferromagnetic films of the reference layer 102 and the storage layer 106.

In some implementations, the MTJ structure 100 has preferred directions of magnetization at arbitrary angles with respect to the magnetic films of the reference layer 102 and the storage layer 106.

In accordance with some implementations, an MRAM device provides at least two states such that they can be assigned to digital signals "0" and "1," respectively. One storage principle of an MRAM is based on the energy barrier required to switch the magnetization of a single-domain magnet (e.g., switch the magnetization of the storage layer 106) from one direction to the other.

FIG. 1B shows representative energy barriers of the reference layer 102 and the storage layer 106 of the MTJ 100 in accordance with some implementations. In accordance with some implementations, the energy barrier refers the amount of energy the magnetic material must overcome in order to switch from one magnetization direction to its opposite (e.g., from the state 114 to the state 116). In an MRAM device, the magnetization direction of the reference layer 102 is generally considered fixed, while the magnetization direction of the storage layer 106 is varied to store the "0" and "1" states. Accordingly, the reference layer 102 is composed of materials such that an energy barrier 112 ($E_{B, ref}$) of the reference layer 102 is larger than the energy barrier 116 ($E_{B, stor}$) of the storage layer 106. In particular, FIG. 1B shows low energy states 114 and 116 for the reference layer 102 separated by the energy barrier 112, and shows low energy states 120 and 122 for the storage layer 106 separated by the energy barrier 118. In some implementations, the storage layer 106 is designed with materials that have a magnetic anisotropy that is high enough to store the magnetization over certain time duration (for e.g., 1 week, 1 month, 1 year, or 10 years).

For an MRAM device with the MTJ structure 100, the resistance states of the MRAM devices are different when the magnetization directions of the reference layer 102 and the storage layer 106 are aligned in a parallel (low resistance state) configuration or in an anti-parallel (high resistance state) configuration, as will be discussed with respect to FIGS. 2A and 2B.

Figure 2A:
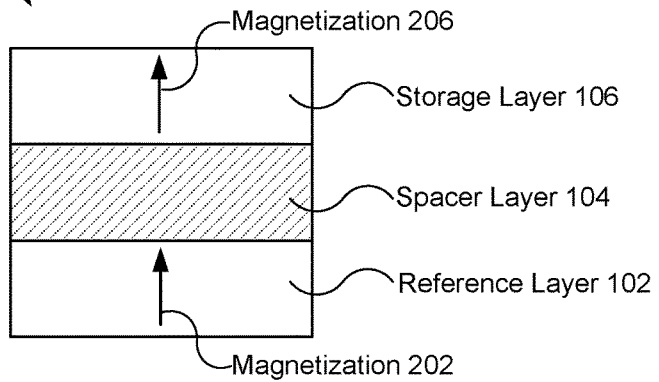
FIGS. 2A-2B illustrate magnetization orientations in a representative perpendicular magnetic tunnel junction (pMTJ) structure in accordance with some implementations.
Figure 2B:
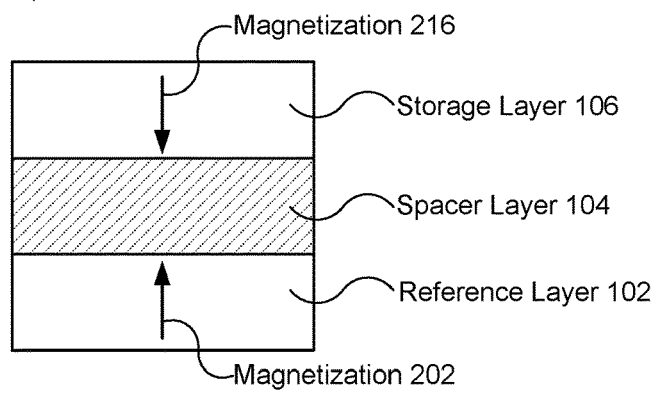

FIGS. 2A-2B illustrate magnetization orientations in a perpendicular magnetic tunnel junction (pMTJ) structure 200 in accordance with some implementations. In some implementations, the pMTJ structure 200 is the same as the MTJ structure 100 presented in FIG. 1A, comprising: the reference layer 102, the spacer layer 104, and the storage layer 106. In some implementations, the pMTJ structure 200 forms part of a MRAM device.

For the pMTJ structure 200 illustrated in FIGS. 2A and 2B, the fixed magnetization direction 202 for the reference layer 102 is chosen to be in an upward direction and is represented by an up arrow. In some implementations (not shown), the fixed magnetization direction of the reference layer 102 in the pMTJ structure 200 is in a downward direction.

FIG. 2A illustrates the magnetization directions of the storage and reference layers in a parallel configuration. In the parallel configuration, the magnetization direction 206 of the storage layer 106 is the same as the magnetization direction 202 of the reference layer 102. In this example, the magnetization direction 202 of the reference layer 102 and the magnetization direction 206 of the storage layer 106 are both in the upward direction. The magnetization direction of the storage layer 106 relative to the fixed layer 102 changes the electrical resistance of the pMTJ structure 200. In accordance with some implementations, the electrical resistance of the pMTJ structure 200 is low when the magnetization direction of the storage layer 106 is the same as the magnetization direction 202 of the reference layer 102. Accordingly, the parallel configuration is also sometimes referred to as a "low (electrical) resistance" state.

FIG. 2B illustrates the magnetization directions of the storage and reference layers in an anti-parallel configuration. In the anti-parallel configuration, the magnetization direction 216 of the storage layer 106 is opposite to the "fixed"

magnetization direction 202 of the reference layer 102. In accordance with some implementations, the electrical resistance of the pMTJ structure 200 is high when the magnetization direction 216 of the storage layer 106 is the opposite of the magnetization direction 202 of the reference layer 102. Accordingly, the anti-parallel configuration is sometimes also referred to as a "high (electrical) resistance" state.

Thus, by changing the magnetization direction of the storage layer 106 relative to that of the reference layer 102, the resistance states of the pMTJ structure 200 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

Although FIGS. 2A-2B show parallel and anti-parallel configurations with the pMTJ structure 200, in some implementations, an in-plane MTJ structure, or an MTJ structure with an arbitrary preferred angle, is used instead.

FIGS. 3A-3D illustrate representative processes for switching the pMTJ 200 between the parallel and anti-parallel configurations in accordance with some implementations. In accordance with some implementations, spin-transfer torque (STT) is used to modify the magnetization directions of an MTJ. STT is an effect in which the magnetization direction of a magnetic layer in an MTJ is modified using a spin-polarized current.

In general, electrons possess a spin, a quantized number of angular momentum intrinsic to the electron. An electrical current is generally unpolarized, e.g., it consists of 50% spin up and 50% spin down electrons. When a current is applied though a magnetic layer, the electrons are polarized with spin orientation corresponding to the magnetization direction of the magnetic layer, thus producing a spin-polarized current (or spin-polarized electrons).

As described earlier, the magnetization direction of the reference layer is "fixed" in an MTJ (e.g., the applied currents are insufficient to change the magnetization state of the reference layer). Therefore, spin-polarized electrons may be used to switch the magnetization direction of the storage layer in the MTJ (e.g., switch between parallel and anti-parallel configurations).

As will be explained in further detail, when spin-polarized electrons travel to the magnetic region of the storage layer in the MTJ, the electrons will transfer a portion of their spin-angular momentum to the storage layer, to produce a torque on the magnetization of the storage layer. When sufficient torque is applied, the magnetization of the storage layer switches, which, in effect, writes either a "1" or a "0" based on whether the storage layer is in the parallel or anti-parallel configuration relative to the reference layer.

Figure 3A:
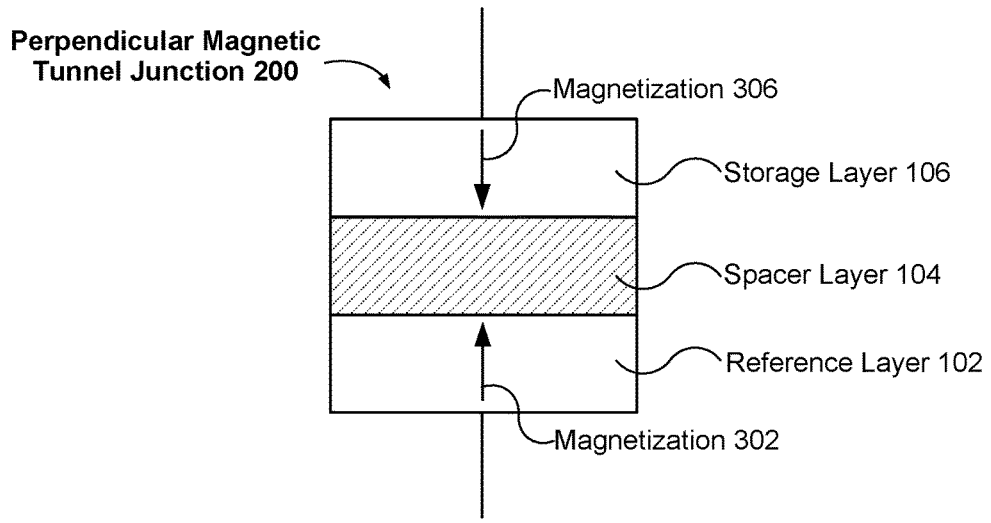
FIGS. 3A-3D illustrate representative processes for switching the pMTJ of FIGS. 2A-2B between the parallel and anti-parallel configurations in accordance with some implementations.
Figure 3B:
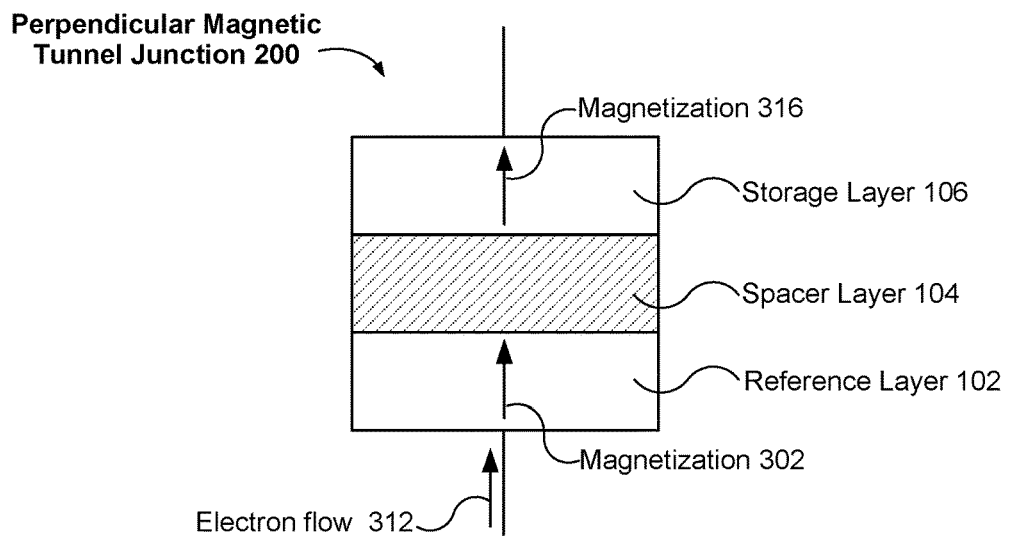

FIGS. 3A-3B illustrate the process of switching from the anti-parallel configuration to the parallel configuration. In FIG. 3A, the pMTJ structure 200 is in the anti-parallel configuration, e.g., the magnetization direction 302 of the reference layer 102 is opposite to the magnetization direction 306 of the storage layer 106.

FIG. 3B shows application of a current such that electrons flow through the pMTJ 200 in accordance with electron flow 312. The electrons are directed through the reference layer 102 which has been magnetized with the magnetization direction 302. As the electrons flow through the reference layer 102, they are polarized (at least in part) by the reference layer 102 and have spin orientation corresponding to the magnetization direction 302 of the reference layer 102. The majority of the spin-polarized electrons tunnel through the spacer layer 104 without losing their polarization and subsequently exert torque on the orientation of magnetization of the storage layer 106. When a sufficiently large current is applied (e.g., a sufficient number of polarized electrons flow into the storage layer 106), the spin torque flips, or switches, the magnetization direction of the storage layer 106 from the magnetization direction 306 in FIG. 3A to the magnetization direction 316 in FIG. 3B.

Thus, as shown in FIG. 3B, the magnetization direction 316 of the storage layer 106 is in the same (upward) direction as the magnetization direction 302 of the reference layer 102. Accordingly, the pMTJ structure 200 in FIG. 3B is in the parallel (low resistance state) configuration. In some implementations and instances, electrons that possess spins in the minority (opposite) direction are reflected at the barrier interfaces and exert torque on the magnetization direction 302 of the reference layer 102. However, the magnetization direction 302 of the reference layer 102 is not switched because the energy, e.g., the amount of electrons, is insufficient to cause switching in the reference layer 102.

Figure 3C:
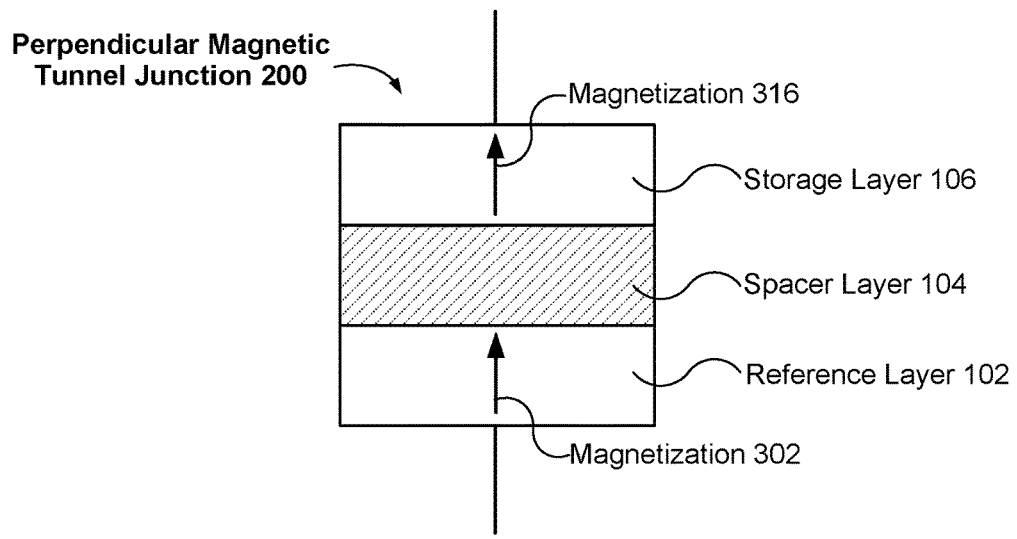
Figure 3D:
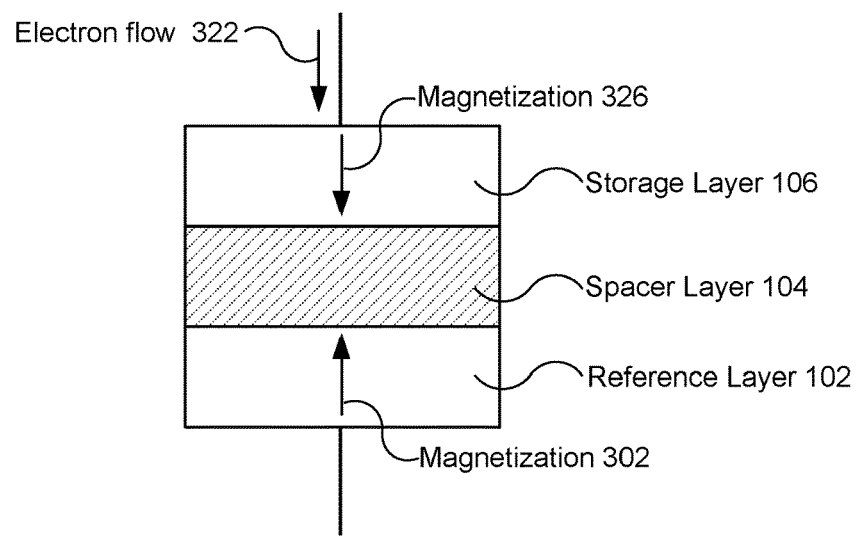

FIGS. 3C-3D illustrate the process of switching from the parallel configuration to the anti-parallel configuration. In FIG. 3C, the pMTJ structure 200 is in the parallel configuration. To initiate switching to the anti-parallel configuration, a current is applied such that electrons flow in accordance with electron flow 322 in FIG. 3D. The electrons flow from the storage layer 106 to the reference layer 102. As the electrons flow through the storage layer 106, they are polarized by the storage layer 106 and have spin orientation corresponding to the magnetization direction 316 of the storage layer 106.

The MTJ structure 200 in FIG. 3C is in the parallel (low resistance state) configuration and thus it has lower electrical resistance, therefore, in some implementations and instances, the majority of the spin-polarized electrons tunnel through the spacer layer 104. Minority spin electrons that are polarized with direction opposite to the magnetization direction 316 of the storage layer 106 are reflected at the barrier interfaces of the spacer layer 104. The reflected spin electrons then exert torque on the magnetization 316 of the storage layer 106, eventually leading to a switch of the magnetization direction 316 of the storage layer 106 in FIG. 3C to a magnetization direction 326 in FIG. 3D. Thus, the pMTJ structure 200 is switched from the parallel (low resistance state) configuration to the anti-parallel (high low resistance state) configuration.

Accordingly, STT allows switching of the magnetization direction of the storage layer 106. MRAM devices employing STT (e.g., STT-MRAM) offer advantages including lower power consumption, faster switching, and better scalability, over conventional MRAM devices that use magnetic field to switch the magnetization directions. STT-MRAM also offers advantages over flash memory in that it provides memory cells with longer life spans (e.g., can be read and written to more times compared to flash memory).

Figure 4:
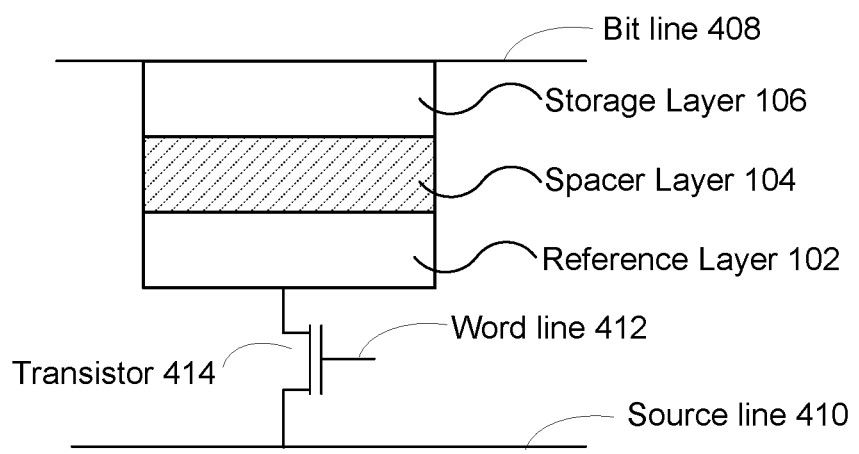
FIG. 4 is a schematic diagram of a representative spin transfer torque (STT) MRAM device in accordance with some implementations.

FIG. 4 is a schematic diagram of a spin transfer torque (STT) MRAM device 400 in accordance with some implementations. The STT-MRAM 400 includes an MTJ device with the reference layer 102, the spacer layer 104, the storage layer 106, and an access transistor 414. The MTJ device is coupled to a bit line 408 and a source line 410 via transistor 414, which is operated by a word line 412. The reference layer 102, the spacer layer 104, and the storage layer 106 compose the MTJ structure 100 and/or the pMTJ structure 200, as described above with reference to FIGS. 1-3. In some implementations, the STT-MRAM 400 includes additional read/write circuitry, one or more additional transistors, one or more sense amplifiers, and/or other components (not shown).

The MTJ structure 100 and/or the pMTJ structure 200 is also sometimes referred to as an MRAM cell. In some implementations, the STT-MRAM 400 contains multiple MRAM cells (e.g., hundreds or thousands of MRAM cells)

arranged in an array coupled to respective bit lines and source lines. During a read/write operation, a voltage is applied between the bit line 408 and the source line 404 (e.g., corresponding to a "0" or "1" value), and the word line 412 enables current to flow between the bit line 408 to the source line 410. In a write operation, the current is sufficient to change a magnetization of the storage layer 106 and thus, depending on the direction of electron flow, bits of "0" and "1" are written into the MRAM cell (e.g., as illustrated in FIGS. 3A-3D). In a read operation, the current is insufficient to change the magnetization of the storage layer 106. Instead, a resistance across the MRAM cell is determined. e.g., with a low resistance corresponding to a logical "0" and a high resistance corresponding to a logical "1."

FIGS. 5A-5B illustrate representative magnetic tunnel junction (MTJ) devices in accordance with some implementations. FIG. 5A illustrates an MTJ device 500 in accordance with some implementations. The MTJ device 500 includes the reference layer 102, the spacer layer 104, and the storage layer 106. The MTJ device 500 further includes free layers 504 and 508 and additional spacer layers 502 and 506. In accordance with some implementations, the free layer 504 is configured to have a higher (less negative) effective magnetization than the storage layer 106. In accordance with some implementations, the free layer 508 is configured to have a higher (less negative) effective magnetization than the free layer 504.

Although the MTJ device 500 is shown with two free layers and additional spacer layers, in various implementations, the MTJ device 500 has more, or less, than two free layers and additional spacer layers. In accordance with some implementations, the free layers 504, 508, the storage layer 106, and the spacer layers 104, 502, and 506 have varying thicknesses. In some implementations, the respective free layers 504, 508 and the storage layer 106 have varying doping levels and/or are composed of distinct materials, while in other implementations, the free layers and the storage layers have essentially the same composition. In some implementations, the spacer layers 104, 502, and 506 have varying doping levels and/or are composed of distinct materials, while in other implementations the spacer layers have essentially the same composition.

FIG. 5B illustrates an MTJ device 520 in accordance with some implementations. The MTJ device 520 includes the reference layer 102, the spacer layer 104, and the storage layer 106. The MTJ device 520 further includes free layers 524 through 532 and additional spacer layers 522 through 530. In accordance with some implementations, moving from bottom to top, each successive free layer is configured to have a higher (less negative) effective magnetization than the prior free layer. For example, the effective magnetization 525 of the free layer 528 is configured to be less negative than the effective magnetization 523 of the free layer 524. Example values for the effective magnetizations are given in Table 1 below:

TABLE 1

Example Magnetization Values

| Layer | Example Value |
|---|---|
| Storage Layer 106 | Effective Magnetization 519 = −8kOe |
| Free Layer 524 | Effective Magnetization 523 = −2kOe |
| Free Layer 528 | Effective Magnetization 525 = −0.5kOe |
| Free Layer 532 | Effective Magnetization 527 = 1kOe |

In accordance with some implementations, an effective magnetization of the storage layer is in the range of −15 kOe to −0.5 kOe. In accordance with some implementations, an effective magnetization of a given free layer is in the range of −3 kOe to 4 kOe.

In accordance with some implementations, the free layers (e.g., layers 524, 528, and 532) have a same, or essentially the same, thickness. In accordance with some implementations, the respective free layers and the storage layer 106 have varying doping levels and/or are composed of distinct materials (as represented by the varying fill patterns of the free layers 524, 528, and 532). In some implementations, at least a subset of the free layers have distinct thicknesses. In some implementations, the spacer layers have varying doping levels and/or are composed of distinct materials, while in other implementations the spacer layers have essentially the same composition.

Figure 6A:
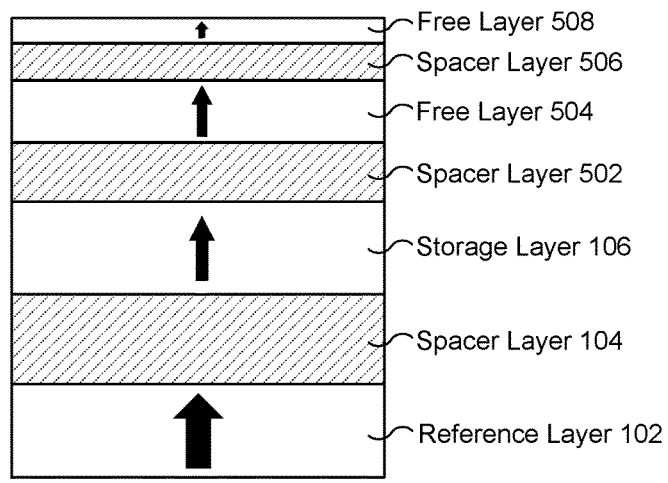
FIGS. 6A-6E illustrate a representative process of switching the magnetic tunnel junction device of FIG. 5A from a parallel configuration to an anti-parallel configuration in accordance with some implementations.

FIGS. 6A-6E illustrate a representative process of switching the magnetic tunnel junction device 500 from a parallel configuration to an anti-parallel configuration in accordance with some implementations. FIG. 6A shows the MTJ device 500 at a first time. At the first time, the MTJ device 500 is in a parallel configuration as the storage layer 106 and the reference layer 102 have a same magnetization direction, as represented by the upward-facing arrows within each layer.

Figure 6B:
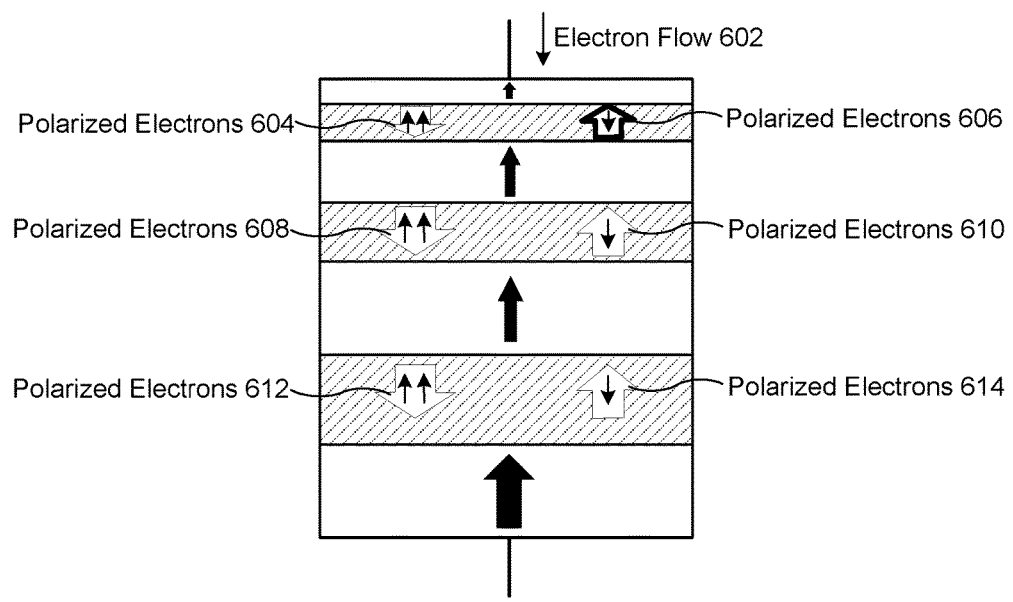

FIG. 6B shows the MTJ device 500 at a second time, subsequent to the first time. At the second time, a current has been applied to the MTJ device 500 such that electrons flow through the device from top to bottom, as represented by electron flow 602. As a result of flowing through the free layer 508, a percentage (e.g., 60%, 70%, or 80%) of the electrons become spin polarized in the magnetization direction of the free layer 508, as represented by the polarized electrons 604. A smaller percentage of the electrons retain a spin polarization opposite of the magnetization direction of the free layer 508, as represented by the polarized electrons 606. The polarized electrons 604 flow through the free layer 504, as represented by the downward-facing arrow around the polarized electrons 604. At least a portion of the polarized electrons 606 are reflected by the free layer 504 back to the free layer 508, as represented by the upward-facing arrow around the polarized electrons 606.

Similarly, as a result of flowing through the free layer 504, a percentage (e.g., 65%, 75%, or 85%) of the electrons become spin polarized in the magnetization direction of the free layer 504, as represented by the polarized electrons 608. A smaller percentage of the electrons retain a spin polarization opposite of the magnetization direction of the free layer 504, as represented by the polarized electrons 610. The polarized electrons 608 flow through the storage layer 106, as represented by the downward-facing arrow around the polarized electrons 608. At least a portion of the polarized electrons 610 are reflected by the storage layer 106 back to the free layer 504, as represented by the upward-facing arrow around the polarized electrons 610.

Similarly, as a result of flowing through the storage layer 506, a percentage (e.g., 70%, 80%, or 90%) of the electrons become spin polarized in the magnetization direction of the storage layer 106, as represented by the polarized electrons 612. A smaller percentage of the electrons retain a spin polarization opposite of the magnetization direction of the storage layer 106, as represented by the polarized electrons 614. The polarized electrons 612 flow through the reference layer 102, as represented by the downward-facing arrow around the polarized electrons 612. At least a portion of the polarized electrons 614 are reflected by the reference layer 102 back to the storage layer 106, as represented by the upward-facing arrow around the polarized electrons 614.

Figure 6C:
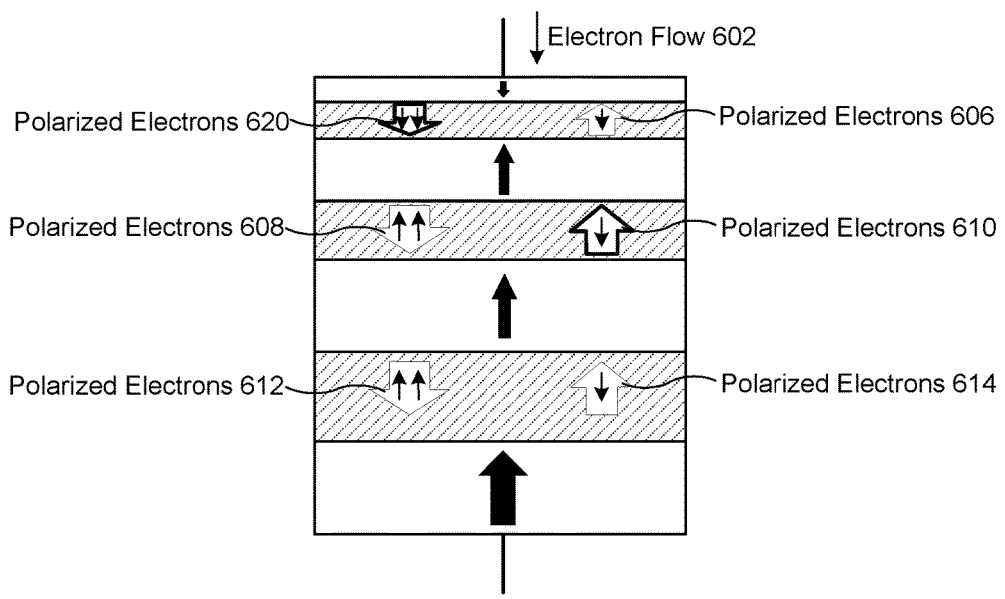

FIG. 6C shows the MTJ device 500 at a third time, subsequent to the second time. At the third time, the magnetization direction of the free layer 508 has switched, as represented by the downward-facing arrow within the free layer 508. In accordance with some implementations, the magnetization direction of the free layer 508 has switched as a result of the polarized electrons 606 exerting sufficient influence on the free layer 508 to reverse its magnetization direction. In some implementations, the free layer 508 and the free layer 504 are configured so as to enable the polarized electrons 606 to exert sufficient influence on the free layer 508. At the third time, as a result of flowing through the free layer 508, a percentage of the electrons become spin polarized in the new (downward) magnetization direction of the free layer 508, as represented by the polarized electrons 620.

Figure 6D:
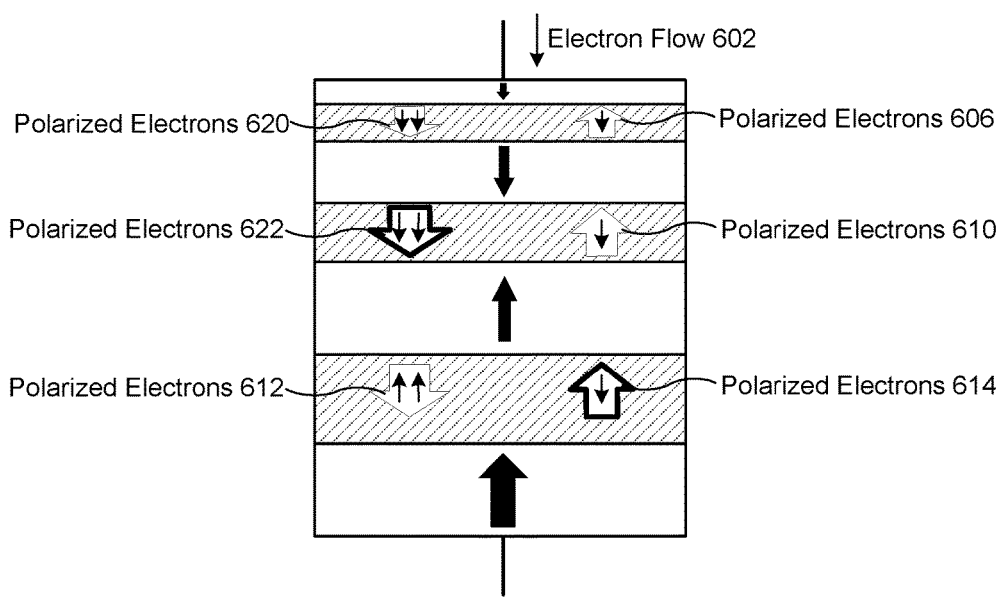

FIG. 6D shows the MTJ device 500 at a fourth time, subsequent to the third time. At the fourth time, the magnetization direction of the free layer 504 has switched, as represented by the downward-facing arrow within the free layer 504. In accordance with some implementations, the magnetization direction of the free layer 504 has switched as a result of the polarized electrons 620 and 610 exerting sufficient influence on the free layer 504 to reverse its magnetization direction. In some implementations, the free layers 504 and 508 and the storage layer 506 are configured so as to enable the polarized electrons 620 and 610 to exert sufficient influence on the free layer 504. At the fourth time, as a result of flowing through the free layer 504, a percentage of the electrons become spin polarized in the new (downward) magnetization direction of the free layer 504, as represented by the polarized electrons 622.

Figure 6E:
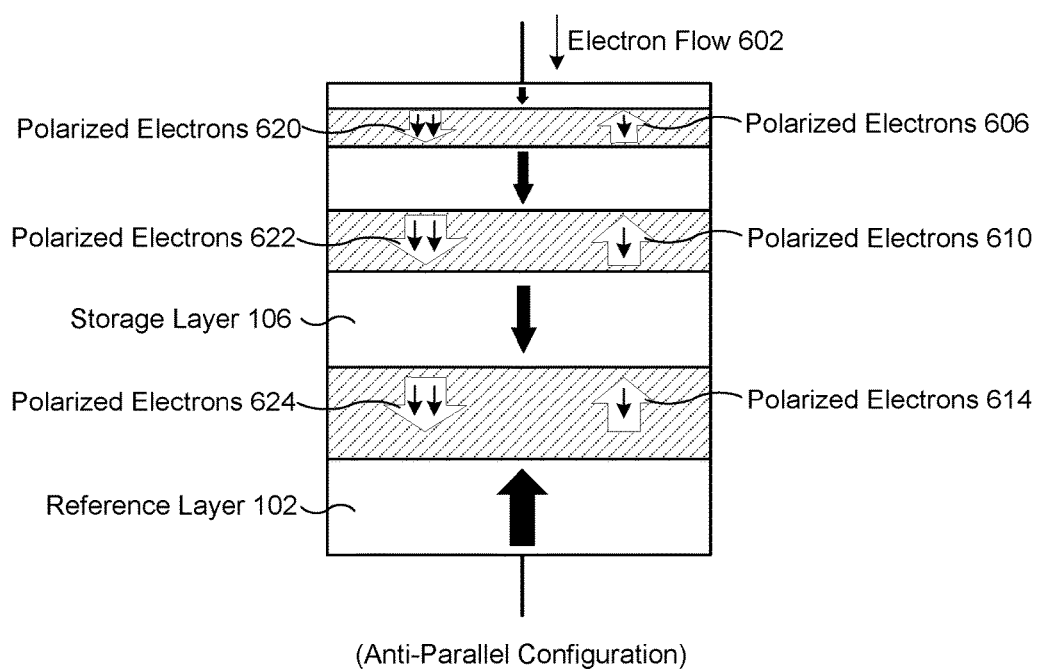

FIG. 6E shows the MTJ device 500 at a fifth time, subsequent to the fourth time. At the fifth time, the magnetization direction of the storage layer 106 has switched, as represented by the downward-facing arrow within the storage layer 106. In accordance with some implementations, the magnetization direction of the storage layer 106 has switched as a result of the polarized electrons 622 and 614 exerting sufficient influence on the storage layer 106 to reverse its magnetization direction. In some implementations, the free layers 504 and 508 and the storage layer 506 are configured so as to enable the polarized electrons 622 and 614 to exert sufficient influence on the storage layer 106. As shown in FIG. 6E, at the fifth time the MTJ device 500 is in an anti-parallel configuration as the storage layer 106 and the reference layer 102 have opposite magnetization directions.

Also, at the fifth time, as a result of flowing through the storage layer 106, a percentage of the electrons become spin polarized in the new (downward) magnetization direction of the storage layer 106, as represented by the polarized electrons 624. In accordance with some implementations, the reference layer 102 is configured such that the polarized electrons 624 do not exert sufficient influence on the reference layer 102 to reverse its magnetization direction.

Thus, FIGS. 6A-6E illustrate a process of switching the MTJ device 500 from a parallel configuration in FIG. 6A to an anti-parallel configuration in FIG. 6E in response to application of a current (e.g., corresponding to electron flow 602).

FIGS. 7A-7E illustrate a representative process of switching the magnetic tunnel junction device of FIG. 5A from an anti-parallel configuration to a parallel configuration in accordance with some implementations.

Figure 7A:
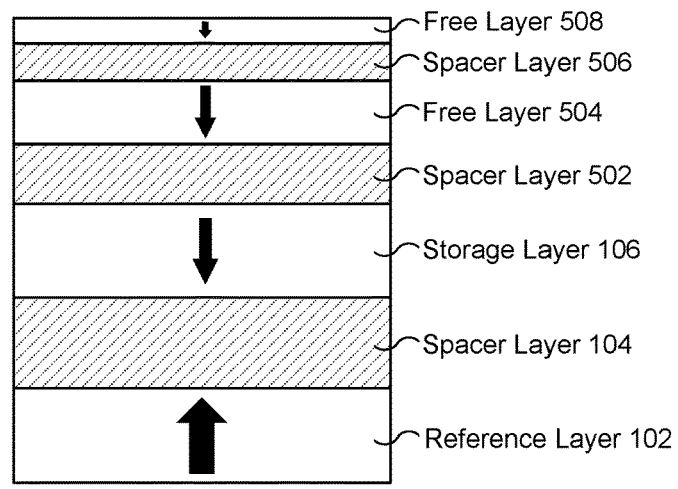
FIGS. 7A-7E illustrate a representative process of switching the magnetic tunnel junction device of FIG. 5A from an anti-parallel configuration to a parallel configuration in accordance with some implementations.

FIG. 7A shows the MTJ device 500 at a first time. At the first time, the MTJ device 500 is in an anti-parallel configuration as the storage layer 106 and the reference layer 102 have opposite magnetization directions, as represented by the upward-facing arrow within the reference layer 102 and the downward-facing arrow within the storage layer 106.

Figure 7B:
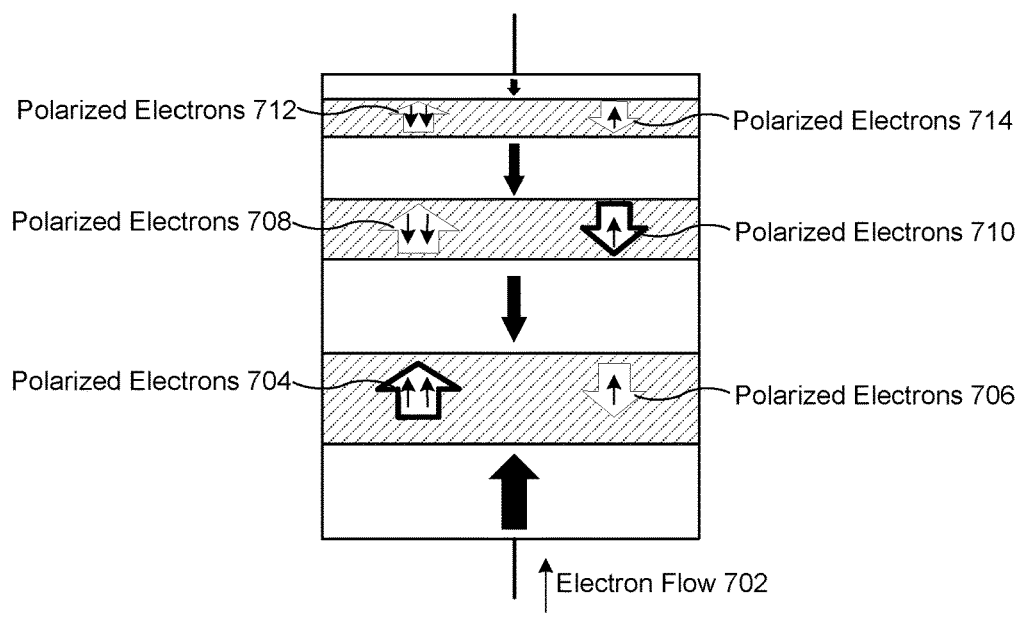

FIG. 7B shows the MTJ device 500 at a second time, subsequent to the first time in FIG. 7A. At the second time, a current has been applied to the MTJ device 500 such that electrons flow through the device from bottom to top, as represented by electron flow 702. As a result of flowing through the reference layer 102, a percentage of the electrons become spin polarized in the magnetization direction of the reference layer 102, as represented by the polarized electrons 704. A smaller percentage of the electrons retain a spin polarization opposite of the magnetization direction of the reference layer 102, as represented by the polarized electrons 706. The polarized electrons 704 flow through the storage layer 106, as represented by the upward-facing arrow around the polarized electrons 704. At least a portion of the polarized electrons 706 are reflected by the storage layer 106 back to the reference layer 102, as represented by the downward-facing arrow around the polarized electrons 706.

As a result of flowing through the storage layer 506, a percentage of the electrons become spin polarized in the magnetization direction of the storage layer 106, as represented by the polarized electrons 708. A smaller percentage of the electrons retain a spin polarization opposite of the magnetization direction of the storage layer 106, as represented by the polarized electrons 710. The polarized electrons 708 flow through the free layer 504, as represented by the upward-facing arrow around the polarized electrons 708. At least a portion of the polarized electrons 710 are reflected by the free layer 504 back to the storage layer 106, as represented by the downward-facing arrow around the polarized electrons 710.

Similarly, as a result of flowing through the free layer 504, a percentage of the electrons become spin polarized in the magnetization direction of the free layer 504, as represented by the polarized electrons 712. A smaller percentage of the electrons retain a spin polarization opposite of the magnetization direction of the free layer 504, as represented by the polarized electrons 714. The polarized electrons 712 flow through the free layer 508, as represented by the upward-facing arrow around the polarized electrons 712. At least a portion of the polarized electrons 714 are reflected by the free layer 508 back to the free layer 504, as represented by the downward-facing arrow around the polarized electrons 714.

Figure 7C:
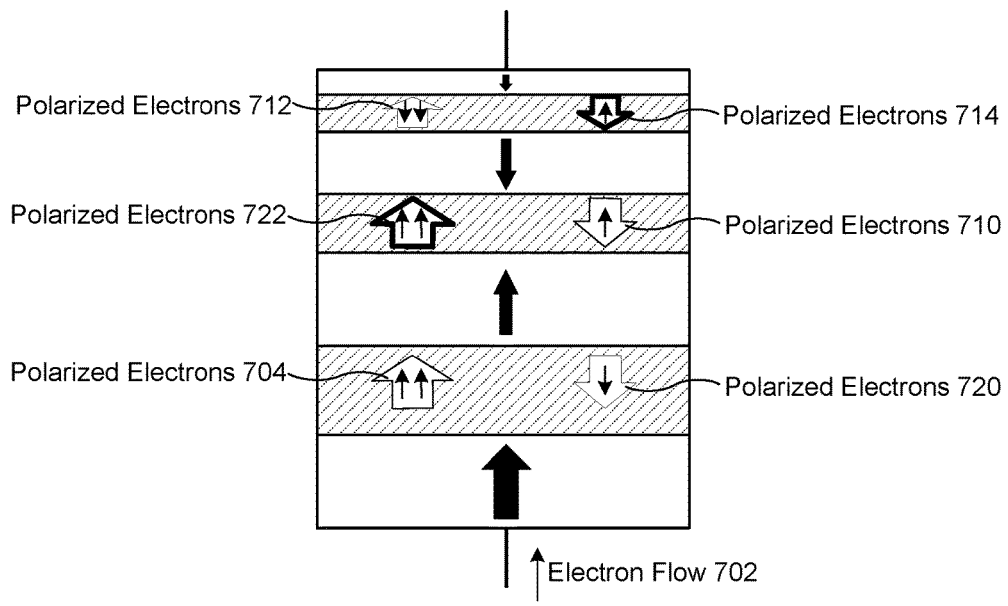

FIG. 7C shows the MTJ device 500 at a third time, subsequent to the second time in FIG. 7B. At the third time, the magnetization direction of the storage layer 106 has switched, as represented by the upward-facing arrow within the storage layer 106. In accordance with some implementations, the magnetization direction of the storage layer 106 has switched as a result of the polarized electrons 704 and 710 exerting sufficient influence on the storage layer 106 to reverse its magnetization direction. Thus, in FIG. 7C the MTJ device 500 is in a parallel configuration as the storage layer 106 and the reference layer 102 have a same magnetization direction (represented by the upward-facing arrow within both layers).

In some implementations, the free layers 504 and 508, the storage layer 106, and/or the reference layer 102 are configured so as to enable the polarized electrons 704 and 710 to exert sufficient influence on the storage layer 106. At the third time, as a result of flowing through the storage layer 106, a percentage of the electrons become spin polarized in the new (upward) magnetization direction of the storage layer 106, as represented by the polarized electrons 722.

Figure 7D:
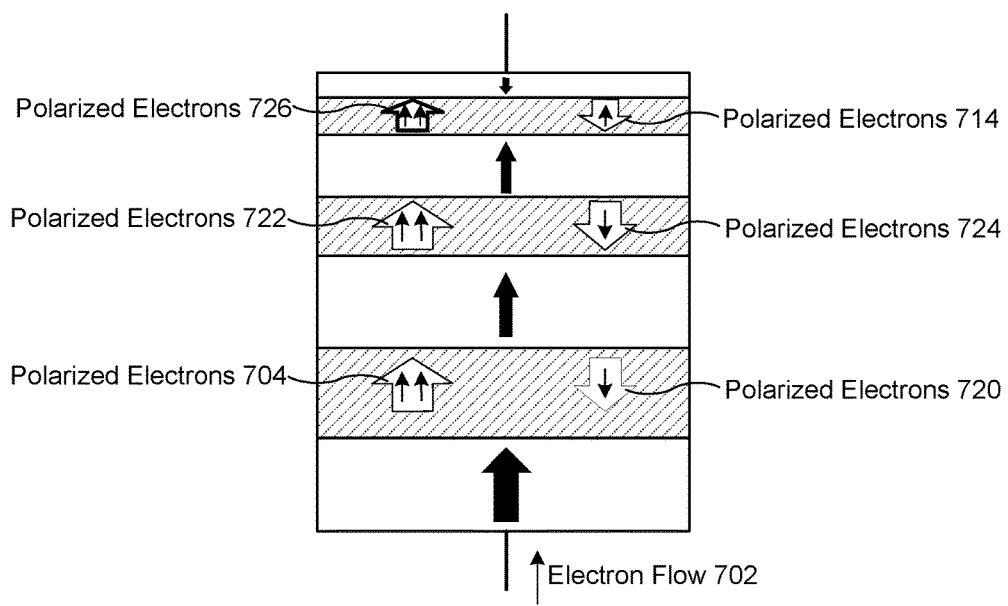

FIG. 7D shows the MTJ device 500 at a fourth time, subsequent to the third time in FIG. 7C. At the fourth time, the magnetization direction of the free layer 504 has switched, as represented by the upward-facing arrow within the free layer 504. In accordance with some implementations, the magnetization direction of the free layer 504 has switched as a result of the polarized electrons 722 and 714 exerting sufficient influence on the free layer 504 to reverse its magnetization direction. In some implementations, the free layers 504 and 508, the storage layer 106, and/or the reference layer 102 are configured so as to enable the polarized electrons 722 and 714 to exert sufficient influence on the free layer 504. At the fourth time, as a result of flowing through the free layer 504, a percentage of the electrons become spin polarized in the new (upward) magnetization direction of the free layer 504, as represented by the polarized electrons 726.

Figure 7E:
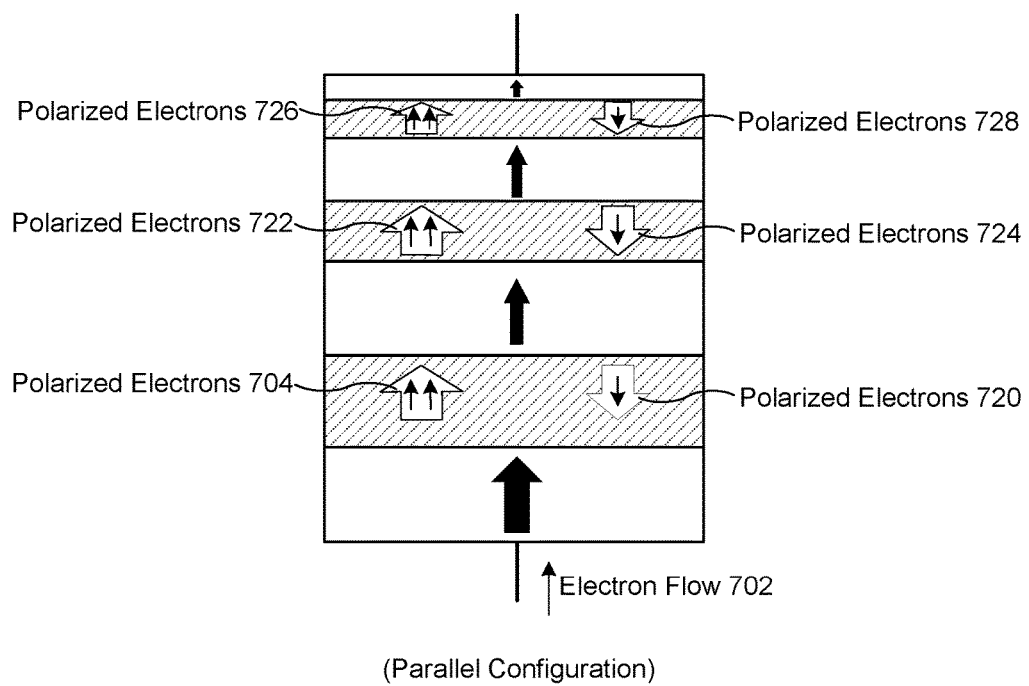

FIG. 7E shows the MTJ device 500 at a fifth time, subsequent to the fourth time in FIG. 7D. At the fifth time, the magnetization direction of the free layer 508 has switched, as represented by the upward-facing arrow within the free layer 508. In accordance with some implementations, the magnetization direction of the free layer 508 has switched as a result of the polarized electrons 726 exerting sufficient influence on the free layer 508 to reverse its magnetization direction. In some implementations, the free layers 504 and 508, the storage layer 106, and/or the reference layer 102 are configured so as to enable the polarized electrons 726 to exert sufficient influence on the free layer 508.

Thus, FIGS. 7A-7E illustrate a process of switching the MTJ device 500 from an anti-parallel configuration in FIG. 7A to a parallel configuration in FIG. 7E in response to application of a current (e.g., corresponding to electron flow 702).

Figure 8:
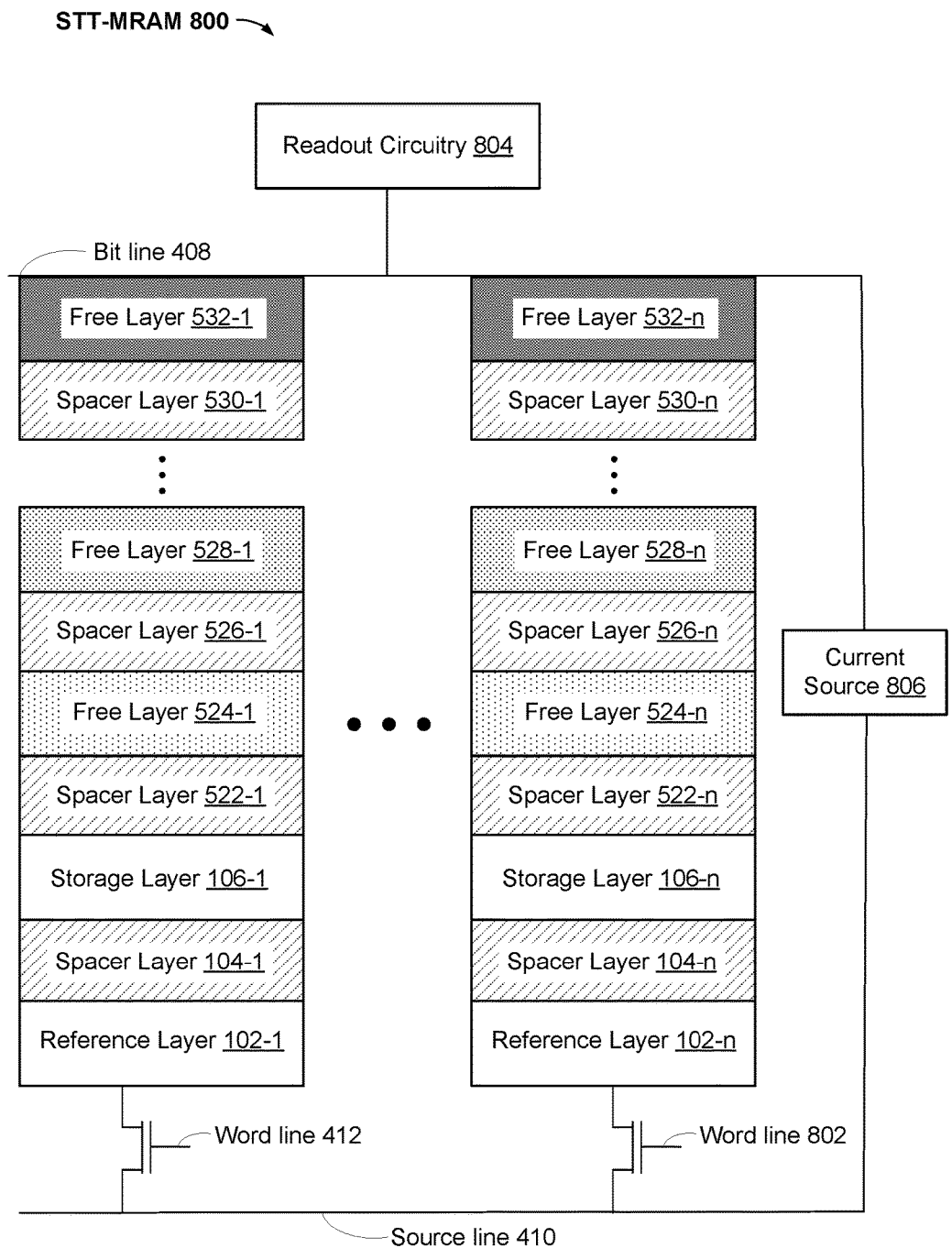
FIG. 8 is a schematic diagram of a representative spin transfer torque (STT) MRAM device comprising multiple magnetic tunnel junction devices of FIG. 5B in accordance with some implementations.

FIG. 8 is a schematic diagram of a spin transfer torque (STT) MRAM device 800 comprising multiple magnetic tunnel junction devices of FIG. 5B in accordance with some implementations. As shown in FIG. 8, the STT-MRAM device 800 includes multiple MTJ devices 520 (e.g., 520-1 through 520-n). Each MTJ device 520 is coupled to the bit line 408 and selectively coupled to the source line 410 (e.g., based on signals received via the word lines 412 and 802).

The STT-MRAM device 800 further includes a current source 806 coupled to the MTJ devices 520 in accordance with some implementations. In some implementations, (not shown) a voltage source is coupled to the MTJ device 520 (e.g., in addition to, or alternatively to, the current source 806). In some implementations, the current source 806 is coupled to only one of the bit line 408 and the source line 410.

The STT-MRAM device 800 further includes readout circuitry 804 coupled to the MTJ devices 520 in accordance with some implementations. In some implementations, the readout circuitry 804 is configured to determine a resistance of respective MTJ device(s). In some implementations, the readout circuitry 804 is configured to determine a configuration (e.g., parallel or anti-parallel) of respective MTJ device(s).

In light of these principles, we now turn to certain implementations.

In accordance with some implementations, a magnetic memory device (e.g., the MTJ device 520, FIG. 5B) includes: (1) a reference magnetic layer (e.g., the reference layer 102) configured to have a first current threshold, the first current threshold corresponding to a spin current level required to change a magnetic polarization of the reference magnetic layer; (2) a composite magnetic layer comprising a plurality of non-magnetic layers (e.g., the spacer layers 522, 526, and 530, FIG. 5B) and a plurality of magnetic layers including a storage layer (e.g., the storage layer 106 and free layers 524, 528, and 532, FIG. 5B); and (3) a non-magnetic spacer layer (e.g., the spacer layer 104) between the reference magnetic layer and the composite magnetic layer. In some implementations, the storage layer is configured to have a second current threshold, lower than the first current threshold, the second current threshold corresponding to a spin current level required to change a magnetic polarization of the storage layer. For example, the storage layer is configured to have a higher (less negative) effective magnetization than the reference layer 102. In some implementations, respective magnetic layers of the plurality of magnetic layers are separated by respective non-magnetic layers of the plurality of non-magnetic layers. For example, FIG. 5B shows alternating spacer layers and free layers.

In some implementations, the composite magnetic layer is configured such that the second current threshold is lowered, without decreasing thermal stability of the magnetic memory device, by spin current and/or coupling fields between adjacent magnetic layers of the plurality of magnetic layers. For example, FIGS. 6A-6E illustrate a process of switching from a parallel configuration to an anti-parallel configuration utilizing spin currents and coupling fields. In some implementations, the plurality of magnetic layers also increases a thermal stability of the device. For example, the spin currents and/or coupling fields of adjacent magnetic layers makes the MTJ device more resistant to perturbations and errors.

In some implementations, the thermal stability of the device is based on the anisotropy field ($H_k$) of the storage layer and/or the size of the device. In some implementations, by varying device size and/or storage layer magnetic anisotropy, different delta (thermal stability) and switching current values can be achieved. In some implementations, changing the magnetic anisotropy includes varying the composition and/or the thickness of the storage layer. In some implementations, varying the composition and/or the thickness of the storage layer involves several depositions steps and/or selective doping.

In some implementations, the storage layer is connected to the reference magnetic layer via the spacer layer. For example, FIG. 5A shows the storage layer 106 separated from the reference layer 102 by the spacer layer 104. In some implementations, the storage layer is the layer of the composite magnetic layer that is in closest proximity to the reference magnetic layer (e.g., is the bottommost layer in the composite magnetic layer). In some implementations, the spacer layer is composed of a high spin polarization material, such as Magnesium Oxide (MgO).

In some implementations, a magnetic characteristic of the device is varied such that a thermal stability and/or second current threshold is achieved. In some implementations, the magnetic characteristic is based on a first magnetic anisotropy and a first offset field on a storage layer of the device. In some implementations, the magnetic characteristic is an anisotropy field, sometimes denoted as $H_k$, of the storage layer. In some implementations, the thermal stability of the device depends on $H_k$ and on the size of the device. In some implementations, the magnetic characteristic is the offset field ($H_{offset}$) imparted on the storage layer of the device by the reference layer of the device.

In some implementations, an electrical characteristic of the device is varied such that a thermal stability and/or second current threshold is achieved. In some implementations, the electrical characteristic is the switching current threshold ($I_{c0}$) of the storage layer. In some implementations, the switching current threshold is dependent on thermal stability. In some implementations, the electrical characteristic is the resistance state $R_{low}$ of the device. In some implementations, $R_{low}$ is dependent on the thickness of the spacer layer and/or the lateral size of the device.

In some implementations, the device has a magnetic characteristic determined by one or more material compositions of the device. In some implementations, the material compositions include materials selected from the group consisting of: MgO, CoFeB, Cobalt, Platinum, Ruthenium, Tungsten, and Tantalum. In some implementations, the switching current value is based on the magnetic characteristic of the device.

In some implementations, the electrical characteristic of the device is a resistance determined based on a geometric property of the device and an RA product (e.g., Resistance× Area) of the device. In some implementations, the geometric property is selected from the group consisting of area, diameter, width and thickness. In some implementations, changing the thickness of the storage layer changes a switching characteristic (e.g., a switching current) of the device. In some implementations, the switching characteristic is proportional to the volume of the device. For example, two devices that share the same size (e.g., the same diameter or width) and have different storage layer thicknesses will also have different switching currents. In some implementations, the geometric property is based on an order of stacking a reference layer, a spacer layer, and a storage layer of the device.

In some implementations, a method of fabricating a magnetic memory device includes: (1) providing a reference magnetic layer (e.g., the reference layer 102) having a first current threshold corresponding to a spin current level required to change a magnetic polarization of the reference magnetic layer; (2) providing a first non-magnetic barrier layer (e.g., the spacer layer 104) positioned on top of the reference magnetic layer; (3) providing a magnetic storage layer (e.g., the storage layer 106) positioned on top of the non-magnetic barrier layer, the magnetic storage layer having a second current threshold, less than the first current threshold, corresponding to a spin current level required to change a magnetic polarization of the magnetic storage layer; (4) providing a second non-magnetic barrier layer (e.g., the spacer layer 502, FIG. 5A) positioned on top of the magnetic storage layer; and (5) providing an additional magnetic layer (e.g., the free layer 504, FIG. 5A) on top of the second non-magnetic barrier layer, the magnetic layer having a third current threshold, less than the second current threshold, corresponding to a spin current level required to change a magnetic polarization of the additional magnetic layer.

In some implementations: (1) the plurality of magnetic layers is arranged in a stack and each successive layer (e.g., from bottom to top) in the stack has a respective current threshold lower than a respective current threshold of the prior layer; and (2) the second current threshold of the storage layer is higher than any other respective current threshold. For example, Table 1 shows successive layers having less negative effective magnetizations, which correspond to lower current thresholds. In some implementations, each successive layer has a respective effective magnetization that is higher (less negative) than a respective magnetization of the prior layer.

In some implementations, the device further includes a first terminal (e.g., the bit line 410, FIG. 8) coupled to the reference layer and a second terminal (e.g., the source line 408, FIG. 8) coupled to the composite layer.

In some implementations, the device further includes a current source (e.g., the current source 806) coupled to the first and second terminals, the current source configured to supply: (1) a first current adapted to facilitate determining the magnetic polarization of the storage layer; (2) a second current adapted to set the magnetic polarization of the storage layer to a first polarization; and (3) a third current adapted to set the magnetic polarization of the storage layer to a second polarization, distinct from the first polarization. In some implementations, the first current is used to determine whether the device is in a polarized (P) or anti-polarized (AP) state (logical one or logical zero), the second current is used set the device in a P state (logical 1), and the third current is used to set the device in the AP state (logical 0).

In some implementations, the device further includes a readout component (e.g., the readout circuitry 804, FIG. 8) coupled to the first terminal and/or the second terminal, the readout component configured to determine whether a resistance between the first terminal and the second terminal exceeds a resistance threshold (e.g., determine whether the device is in a P or AP state).

In some implementations, the non-magnetic spacer layer and each non-magnetic layer of the plurality of non-magnetic layers is composed of an insulator and/or a non-ferromagnetic material.

In some implementations, the reference magnetic layer and each magnetic layer of the plurality of magnetic layers is composed of a ferromagnetic material. In some implementations, the magnetic layers (e.g., the storage layer and the reference layer) are composed of thin (e.g., 0.5 nm-10 nm) CoFeB with various compositions. In some implementations, the magnetic layers are composed of Boron varying between 10% and 40%.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first device could be termed a second device, and, similarly, a second device could be termed a first device, without departing from the scope of the various described implementations. The first device and the second device are both electronic devices, but they are not the same device unless it is explicitly stated otherwise.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A magnetic memory device, comprising:
    a reference magnetic layer configured to have a first current threshold, the first current threshold corresponding to a spin current level required to change a magnetic polarization of the reference magnetic layer;
    a composite magnetic layer comprising a plurality of non-magnetic layers and a plurality of magnetic layers including a storage layer having a first effective magnetization, wherein the plurality of magnetic layers is arranged in a stack such that: (a) the storage layer is closest to the reference magnetic layer, and (b) each successive layer from the storage layer in the plurality of magnetic layers has a more positive effective magnetization than the prior layer;
    wherein the storage layer is configured to have a second current threshold, lower than the first current threshold, the second current threshold corresponding to a spin current level required to change a magnetic polarization of the storage layer;
    wherein respective magnetic layers of the plurality of magnetic layers are separated by respective non-magnetic layers of the plurality of non-magnetic layers; and
    wherein the composite magnetic layer is configured such that the second current threshold is lowered when transitioning the magnetic memory device between parallel and anti-parallel states, without decreasing thermal stability of the magnetic memory device, by at least one of spin current, and coupling fields between adjacent magnetic layers of the plurality of magnetic layers; and
    a non-magnetic spacer layer between the reference magnetic layer and the composite magnetic layer.

2. The magnetic memory device of claim 1, wherein the storage layer is connected to the reference magnetic layer via the non-magnetic spacer layer.

3. The magnetic memory device of claim 1, further comprising a first terminal coupled to the reference layer and a second terminal coupled to the composite layer.

4. The magnetic memory device of claim 3, further comprising a current source coupled to the first and second terminals, the current source configured to supply:
    a first current adapted to facilitate determining the magnetic polarization of the storage layer;
    a second current adapted to set the magnetic polarization of the storage layer to a first polarization; and
    a third current adapted to set the magnetic polarization of the storage layer to a second polarization, distinct from the first polarization.

5. The magnetic memory device of claim 3, further comprising a readout component coupled to at least one of the first terminal, and the second terminal, the readout component configured to determine whether a resistance between the first terminal and the second terminal exceeds a resistance threshold.

6. The magnetic memory device of claim 1, wherein the non-magnetic spacer layer and each non-magnetic layer of the plurality of non-magnetic layers is composed of at least one of an insulator, and a non-ferromagnetic material.

7. The magnetic memory device of claim 1, wherein the reference magnetic layer and each magnetic layer of the plurality of magnetic layers is composed of a ferromagnetic material.

* * * * *